United States Patent
Xiang (10) Patent No.: US 10,004,269 B2
(45) Date of Patent: Jun. 26, 2018

(54) CONTROL CIRCUIT, ELECTRONIC CIGARETTE AND METHOD FOR CONTROLLING ELECTRONIC CIGARETTE

(71) Applicant: KIMREE HI-TECH INC., Road Town, Tortola (VG)

(72) Inventor: Zhiyong Xiang, Guangdong (CN)

(73) Assignee: HUIZHOU KIMREE TECHNOLOGY CO., LTD. SHENZHEN BRANCH, Shenzhen (CN)

( * ) Notice: Subject to any disclaimer, the term of this patent is extended or adjusted under 35 U.S.C. 154(b) by 0 days. days.

(21) Appl. No.: 15/323,207

(22) PCT Filed: Jun. 30, 2014

(86) PCT No.: PCT/CN2014/081192
§ 371 (c)(1),
(2) Date: Dec. 30, 2016

(87) PCT Pub. No.: WO2016/000141
PCT Pub. Date: Jan. 7, 2016

(65) Prior Publication Data
US 2017/0127726 A1 May 11, 2017

(51) Int. Cl.
*A24F 47/00* (2006.01)
*H05B 33/08* (2006.01)
(Continued)

(52) U.S. Cl.
CPC ........ *A24F 47/008* (2013.01); *G01R 31/3606* (2013.01); *G01R 31/3689* (2013.01);
(Continued)

(58) Field of Classification Search
CPC .... A24F 47/008; A24F 47/002; H02J 7/0047; H05B 33/086; H05B 1/0244
See application file for complete search history.

(56) References Cited

U.S. PATENT DOCUMENTS 9,423,152 B2 * 8/2016 Ampolini .............. A24F 47/008
2012/0199146 A1 8/2012 Marangos
(Continued)

FOREIGN PATENT DOCUMENTS

CN 101116542 A 2/2008
CN 201299094 Y 9/2009
(Continued)

OTHER PUBLICATIONS

International Search Report (ISR) issued by the State Intellectual Property Office of the Peoples Republic of China dated Mar. 27, 2015 for PCT/CN2014/081192, China.

*Primary Examiner* — Briggitte R Hammond
(74) *Attorney, Agent, or Firm* — Tim Tingkang Xia, Esq.; Locke Lord LLP (57) ABSTRACT

A control circuit, an electronic cigarette and a method for controlling the electronic cigarette, the control circuit includes at least one airflow sensor, a microcontroller, a battery, an audio module and an indication unit; the airflow sensor for collecting an airflow signal, converting the airflow signal into a smoking signal and sending the smoking signal to the microcontroller, the microcontroller is used for controlling the audio module to give out hookah-simulating water sounds according to the received smoking signal and simultaneously controlling the indication unit to display a smoking color; and the microcontroller is further used for controlling the indication unit to display different indication colors according to different charging states of the battery. Therefore water sounds can be given out by electronic simulation, and the function of electronically simulating real hookah water sounds is conducive to usage of the electronic cigarette and smoking cessation.

15 Claims, 4 Drawing Sheets

(51) Int. Cl.
*G01R 31/36* (2006.01)
*H04R 3/00* (2006.01)
*H05B 1/02* (2006.01)
*H04R 1/02* (2006.01)
*H02J 7/00* (2006.01)

(52) U.S. Cl.
CPC ............ *H02J 7/007* (2013.01); *H02J 7/0029* (2013.01); *H04R 1/028* (2013.01); *H04R 3/00* (2013.01); *H05B 1/0244* (2013.01); *H05B 33/086* (2013.01); *H02J 2007/004* (2013.01); *H02J 2007/0037* (2013.01); *H04R 2201/028* (2013.01)

(56) References Cited

U.S. PATENT DOCUMENTS

| | | | | |
|---|---|---|---|---|
| 2013/0340775 | A1* | 12/2013 | Juster | H04L 67/42 |
| | | | | 131/273 |
| 2014/0278250 | A1* | 9/2014 | Smith | A24F 47/002 |
| | | | | 702/187 |
| 2015/0216237 | A1* | 8/2015 | Wensley | A24F 47/008 |
| | | | | 131/273 |

FOREIGN PATENT DOCUMENTS

| | | |
|---|---|---|
| CN | 202445136 U | 9/2012 |
| CN | 203662027 U | 6/2014 |
| CN | 203662029 U | 6/2014 |
| CN | 204070537 U | 1/2015 |

* cited by examiner

CONTROL CIRCUIT, ELECTRONIC CIGARETTE AND METHOD FOR CONTROLLING ELECTRONIC CIGARETTE

FIELD OF THE INVENTION

The present application relates to the field of electronic cigarettes controlling, and more particularly relates to a control circuit, an electronic cigarette and a method for controlling the electronic cigarette.

BACKGROUND OF THE INVENTION

Normally, an electronic cigarette in the prior arts comprises a battery rod and an atomizer, when smokers inhale, high speed airflow is formed, the airflow sensor senses the airflow and then generates a smoking signal to transmit to a microcontroller, the microcontroller controls an electrical power supply circuit of a battery and the atomizer to switch on according to the smoking signal received, a heating wire in the atomizer generates heat, smoke flow is heated, evaporated and atomized to form aerosol for simulating smoke.

A large number of electronic cigarettes in the prior arts are made in hookah shapes, but they cannot simulate a water sound of a real hookah, or the water sound is produced by coordinating with a bottle or a basin of storing water when users are smoking, then the electronic cigarettes are large in volume and relatively heavy, and it is not conducive to usage of the electronic cigarettes.

SUMMARY OF THE INVENTION

Technical problems to be solved in the present invention is to provide a control circuit, an electronic cigarette and a method for controlling the electronic cigarette, aiming at defects in the prior arts that the water sound of the real hookah cannot be electronically simulated.

The technical solutions of the present invention for solving the technical problems are as follows: to provide a control circuit for controlling an electronic cigarette, the control circuit comprises at least one airflow sensor, a microcontroller connected to the airflow sensor, a battery for providing an internal power supply, and an audio module and an indication unit both connected to the microcontroller;

The airflow sensor is configured for collecting an airflow signal upon every air inhalation into the electronic cigarette, converting the airflow signal into a smoking signal and sending the smoking signal to the microcontroller, the microcontroller is configured for controlling the audio module to give out a hookah-simulating water sound according to the smoking signal received, and simultaneously controlling the indication unit to display a smoking color; the microcontroller is further configured for controlling the indication unit to display different indication colors according to different charging states of the battery;

The audio module is electrically connected to the battery. The audio module comprises an audio chip connected to the microcontroller, and further comprises a filter unit and a sound amplifying unit which are connected to the audio chip respectively, and a speaker connected to the filter unit and the sound amplifying unit respectively, the microcontroller is configured for starting the audio chip when the smoking signal is received, the audio chip outputs a prerecorded water sound audio signal, and the water sound audio signal is amplified by the sound amplifying unit, then the speaker is driven to give out the hookah-simulating water sound; and The filter unit comprises a resistor R5, an inductor L1 and a capacitor C30, the sound amplifying unit comprises a resistor R56, a resistor R29 and a switch tube Q11, one end of the resistor R5 and the inductor L1 after being connected in parallel is connected to the battery and a reset end of the audio chip, the other end of the resistor R5 and the inductor L1 after being connected in parallel is connected to the speaker; one end of the resistor R56 is connected to an audio signal output terminal of the audio chip, the other end of the resistor R56 is connected to one end of the resistor R29 and a base of the switch tube Q11, the other end of the resistor R29 and an emitter of the switch tube Q11 are both grounded, a collector of the switch tube Q11 is connected to the speaker.

In the above control circuit, the indication unit comprises a tricolor LED lamp, the tricolor LED lamp comprises a red light-emitting diode, a blue light-emitting diode and a green light-emitting diode, anodes of the red light-emitting diode, the blue light-emitting diode and the green light-emitting diode are all connected to a positive electrode of the battery;

The indication unit further comprises three switch tubes which are respectively connected to a cathode of the red light-emitting diode, a cathode of the blue light-emitting diode and a cathode of the green light-emitting diode, grids of the three switch tubes are respectively and correspondingly connected to three output terminals of the microcontroller.

In the above control circuit, the microcontroller comprises three input terminals, the control circuit further comprises six resistors R35 to R40, series connected resistors R35 and R36, series connected resistors R37 and R38, and series connected resistors R39 and R40 are respectively connected in parallel between the positive electrode of the battery and the ground, the three input terminals are respectively and correspondingly connected to a connecting point of the resistors R35 and R36, a connecting point of the resistors R37 and R38, and a connecting point of the resistors R39 and R40.

In the above control circuit, the microcontroller further comprises a memory cell, the memory cell stores level states of the three input terminals and the colors corresponding to the level states of the three input terminals for indicating the different charging states of the battery;

According to the level states of the three input terminals, the microcontroller finds a first color corresponding to an indication of the different charging states when the microcontroller fails to detect the smoking signal, and controls the tricolor LED lamp to emit a light of the first color via the three input terminals, charging states of the battery comprises a charging state and a full power state.

In the above control circuit, the first color comprises a color configured for indicating the battery is in the charging state and a color configured for indicating the battery is in the full power state, the color configured for indicating the battery is in the charging state is different with the color configured for indicating the battery is in the full power state.

In the above control circuit, the memory cell is further configured to store a second color corresponding to the level states of the three input terminals for indicating that an user is smoking;

According to the level states of the three input terminals, the microcontroller finds the second color corresponding to an indication that the user is smoking when the microcontroller detects the smoking signal, and controls the tricolor LED lamp to emit a light of the second color via the three input terminals, the second color is the smoking color.

In the above control circuit, the control circuit further comprises a battery protective module connected to the battery, the battery protective module comprises a protective control chip and a first switch unit which is connected to the control chip, the protective control chip is configured for detecting an over charged state and an over discharged state of the battery, and controlling the first switch unit to turn off when the battery is in the over charged state or the over discharged state.

In the above control circuit, the control circuit further comprises a second switch unit connected to the microcontroller, the microcontroller is configured for controlling the second switch unit to turn on when the microcontroller detects the smoking signal, so as to switch on a power supply circuit between the battery and an electronic cigarette atomizer to realize an atomization of cigarette oil of the electronic cigarette.

In the above control circuit, the control circuit further comprises a charge management module connected to the battery and configured for processing a charge management for the battery and transmitting the charging states of the battery to the microcontroller, the battery is charged by a direct current power supply which is converted by an external power source through a direct current adapter.

The present invention further provides an electronic cigarette, the electronic cigarette comprises the control circuit according to anyone specification above.

In the above electronic cigarette, the electronic cigarette comprises an atomizer configured for atomizing the cigarette oil, the atomizer comprises a heating wire, when the control circuit detects the smoking signal, the control circuit controls the atomizer to work, the heating wire generates heat to realize an atomization of cigarette oil of the electronic cigarette.

The present invention further provides a method for controlling an electronic cigarette, the method for controlling comprises:

collecting an airflow signal upon every air inhalation into the electronic cigarette, converting the airflow signal into a smoking signal and sending the smoking signal to the microcontroller by an airflow sensor;

controlling an audio module to give out a hookah-simulating water sound according to the smoking signal received and simultaneously controlling an indication unit to display a smoking color by the microcontroller.

In the above method for controlling an electronic cigarette, the microcontroller further comprises a memory cell, the memory cell stores level states of three input terminals of the microcontroller and colors corresponding to the level states of the three input terminals for indicating different charging states of the battery; if the microcontroller fails to detect the smoking signal, the method for controlling further comprises:

finding a first color corresponding to an indication of the different charging states, and controlling a tricolor LED lamp to emit a light of the first color via the three input terminals by the microcontroller, according to the level states of the three input terminals of the microcontroller.

In the above method for controlling an electronic cigarette, the memory cell also stores a second color corresponding to the level states of the three input terminals for indicating that an user is smoking; if the microcontroller detects the smoking signal, the method for controlling further comprises:

finding the second color corresponding to an indication that the user is smoking, and controlling the tricolor LED lamp to emit a light of the second color via the three input terminals by the microcontroller, according to the level states of the three input terminals of the microcontroller.

In the above method for controlling an electronic cigarette, after that a direct current power supply is obtained by being converted by an external power source through a direct current adapter, a charge management module processes a charge management for the battery and transmits charging states of the battery to the microcontroller, the charging states of the battery comprises a charging state and a full power state.

In the above method for controlling an electronic cigarette, the method for controlling further comprises:

the microcontroller controls an atomizer of the electronic cigarette to work according to the smoking signal received, so as to realize an atomization of cigarette oil of the electronic cigarette.

With applications of the control circuit, the electronic cigarette and the method for controlling the electronic cigarette, the present invention has following advantages: by defining the microcontroller to control the audio module to produce a water sound of a hookah when the microcontroller receives the smoking signal, it realizes that the water sound can be given out by means of electronic simulation when a smoker smokes the electronic cigarette, it has no need to behavior as the electronic cigarettes in the prior arts that to coordinate with a bottle or a basin of storing water to produce the water sound when users are smoking, through a function of electronically simulating real hookah water sounds, it is conducive to usage of the electronic cigarette and smoking cessation, and as filter is processed by the filter unit which has a simple and skillful structure, and after the audio signal is amplified by the sound amplifying unit, the water sound has better sound quality and a larger volume, and it can vividly imitate a sound of an electronic hookah to significantly improve users' experience, and take advantages on avoiding a small sound, instability, a lot of noise, poor sound quality and other issues. Meanwhile, by defining the microcontroller to control the tricolor LED lamp to display different colors in different charging states, it realizes that the color indicating that the electronic cigarette is being smoked is shown when the users are smoking electronic smoke, the colors indicating that the battery is in the charging state or is in the full power state are shown when the users does not smoke, thereby users' experience is improved.

BRIEF DESCRIPTION OF THE DRAWINGS

Further specification of the present invention is processed by a combination of accompanying drawings and embodiments as below, in the accompanying drawings.

DETAILED DESCRIPTION OF THE PREFERRED EMBODIMENTS

To make the technical feature, objective and effect of the present application be understood more clearly, now the specific implementation of the present application is described in detail with reference to the accompanying drawings and embodiments.

Figure 1:
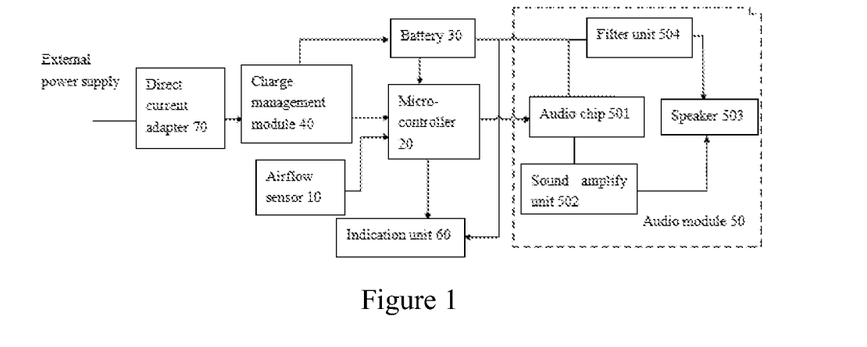
FIG. 1 is a principle block diagram of a control circuit embodiment of the present invention which is matched with a direct current adapter.

As shown in FIG. 1 which is the principle block diagram of an embodiment of the control circuit in the present invention, the control circuit is configured for controlling the electronic cigarette and comprises at least one airflow sensor 10, a microcontroller 20, a battery 30, a charge management module 40, an audio module 50 and an indication unit 60. The battery 30 provides an internal power supply to supply electrical power to every module in the control circuit. The airflow sensor 10 is connected with the microcontroller 20, and is configured for collecting an airflow signal upon every air inhalation into the electronic cigarette, converting the airflow signal into a smoking signal and sending the smoking signal to the microcontroller 20, the microcontroller 20 is connected to the audio module 50, when the smoking signal is received, the microcontroller 20 controls the audio module 50 to give out a hookah-simulating water sound and simultaneously controls the indication unit 60 to display a smoking color, when the smoking signal is not received by the microcontroller 20, the microcontroller 20 controls the indication unit 60 to display different indication colors according to different charging states of the battery 30.

In the above control circuit, the battery 30 can be charged by a direct current adapter 70 which is connected to the charge management module 40, the direct current adapter 70 is configured for converting an external power supply, such as 220V alternating current, into a suitable direct current power supply to charge the battery 30 via the charge management module 40, the charge management module 40 is connected to the battery 30 and the microcontroller 20 respectively, and is configured for processing a charge management for the battery 30 and transmitting charging states of the battery 30 to the microcontroller 20, the charging states of the battery 30 comprises two states which are a charging state and a full power state.

Specifically, the audio module 50 is connected to the battery 30, the audio module 50 comprises an audio chip 501 which is connected to the microcontroller 20, and further comprises a filter unit 504 and a sound amplifying unit 502 which are connected to the audio chip 501 respectively, and a speaker 503 which is connected to the filter unit 504 and the sound amplifying unit 502 respectively. When the smoking signal is received, the microcontroller 20 starts the audio chip 501, then the audio chip 501 outputs a water sound audio signal which is prerecorded, and the water sound audio signal is processed a filtering through the filter unit 504 and amplified by the sound amplifying unit 502, after that, the speaker 503 is driven to give out the hookah-simulating water sound. The audio chip 501 stores the water sound audio signal, and the water sound audio signal can be set before leaving the factory or prerecorded. Therefore, by controlling the control circuit, it can realizes that the water sound can be given out by simulating when a smoker smokes the electronic cigarette, it has no need to behavior as the electronic cigarette in the prior arts that to coordinate with a bottle or a basin of storing water to produce the water sound when users are smoking, through a function of electronically simulating the real hookah water sounds, it is conducive to the electronic cigarette usage and smoking cessation, Specifically, the indication unit 60 is connected to the microcontroller 20, and is controlled by microcontroller 20, the indication unit 60 comprises a tricolor LED lamp, the tricolor LED lamp comprises a red light-emitting diode, a blue light-emitting diode and a green light-emitting diode, anodes of the red light-emitting diode, the blue light-emitting diode and the green light-emitting diode are all connected to a positive electrode of the battery 30, and are supplied electrical power by the battery 30. The indication unit 60 further comprises three switch tubes which are respectively connected to a cathode of the red light-emitting diode, a cathode of the blue light-emitting diode and a cathode of the green light-emitting diode, grids of the three switch tubes are respectively and correspondingly connected to three output terminals of the microcontroller 20. The microcontroller 20 comprises three input terminals which are connected to the positive electrode of the battery 30 or grounded respectively, if an input terminal is connected to the battery, then a level state of the input terminal is high, if an input terminal is grounded, a level state of the input terminal is low.

The microcontroller 20 above further comprises a memory cell (not shown in figures), the memory cell stores level states of the three input terminals of microcontroller 20 and the colors corresponding to the level states of the three input terminals above for indicating the different charging states of the battery 30. When the microcontroller 20 fails to detect the smoking signal, the microcontroller 20 finds a first color corresponding to an indication of the different charging states of the battery according to the level states of the three input terminals, and controls the tricolor LED lamp to emit a light of the first color via the three input terminals which are connected to the tricolor LED lamp. Specifically, the first color comprises a color configured for indicating the battery 30 is in the charging state and a color configured for indicating the battery 30 is in the full power state, meanwhile, the color configured for indicating the battery 30 is in the charging state is different with the color configured for indicating the battery 30 is in the full power state.

The memory cell above also stores a second color corresponding to the level states of the three input terminals of the microcontroller 20 for indicating that an user is smoking, namely, the color indicated by the tricolor LED lamp which is controlled through the microcontroller 20 when the microcontroller 20 receives the smoking signal. When the microcontroller 20 detects the smoking signal, according to the level states of the three input terminals, the microcontroller 20 finds the second color corresponding to an indication that the user is smoking, and controls the tricolor LED lamp to emit a light of the second color via the three input terminals of the when the microcontroller 20. Therefore, the control circuit realizes technical effects that the color indicating that the electronic cigarette is being smoked is shown when the users smoking electronic smoke, the colors indicating that the battery is in the charging state or is in the full power state are shown when the users does not smoke, thereby users' experience is improved.

In the control circuit above, the control circuit further comprises a battery protective module (not shown in figures) connected to the battery 30, the battery protective module comprises a protective control chip and a first switch unit (not shown in figures) which is connected to the control chip, the protective control chip is configured for detecting an over charged state and an over discharged state of the battery 30, and controlling the first switch unit to turn off when the battery 30 is in the over charged state or the over discharged state, so as to realize that the battery 30 no longer supplies the electrical power to loads (in the present embodiment, loads refer to each module in the control circuit which is electrically powered by the battery). Besides, the control circuit further comprises a second switch unit (not shown in figures) connected to the microcontroller 20, when the microcontroller 20 detects the smoking signal, the microcontroller 20 controls the second switch unit to turn on, so as to turn on a power supply circuit between the battery 30 and the electronic cigarette atomization assembly to realize an atomization of cigarette oil of the electronic cigarette.

Figure 2:
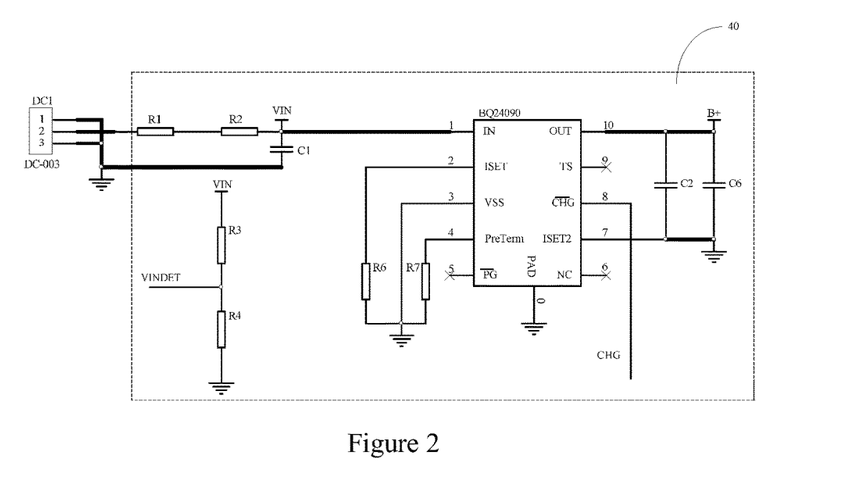
FIG. 2 is a circuit diagram of a charging management module 40 in FIG. 1.

FIG. 2 is a circuit diagram of a charging management module 40 in FIG. 1, as illustrated by FIG. 2, the charging management module 40 is configured for being connected to an interface DC1 of the direct current adapter 70, the charging management module 40 is applied by a chip of model BQ24090, after that the external power supply is converted to a suitable direct current power supply by a direct current adapter, the suitable direct current power supply provides electrical power to the chip via an input pin of resistors R1 and R2 to chip BQ24090, namely, a "1" pin, and then changes the battery 30 via the chip (in the FIG. 2, B+ represents for the positive electrode of the battery 30, B− represents for a negative electrode of the battery 30), besides, transmits the charging status of the battery 30 to the microcontroller 20 via a "8" pin, if the battery 30 is in the charging state, then the "8" pin of the chip BQ24090 sends a low level signal to the microcontroller 20, if the battery 30 is fully charged, namely, is in the full power state, then the "8" pin of the chip BQ24090 sends a high level signal to the microcontroller 20.

Figure 3:
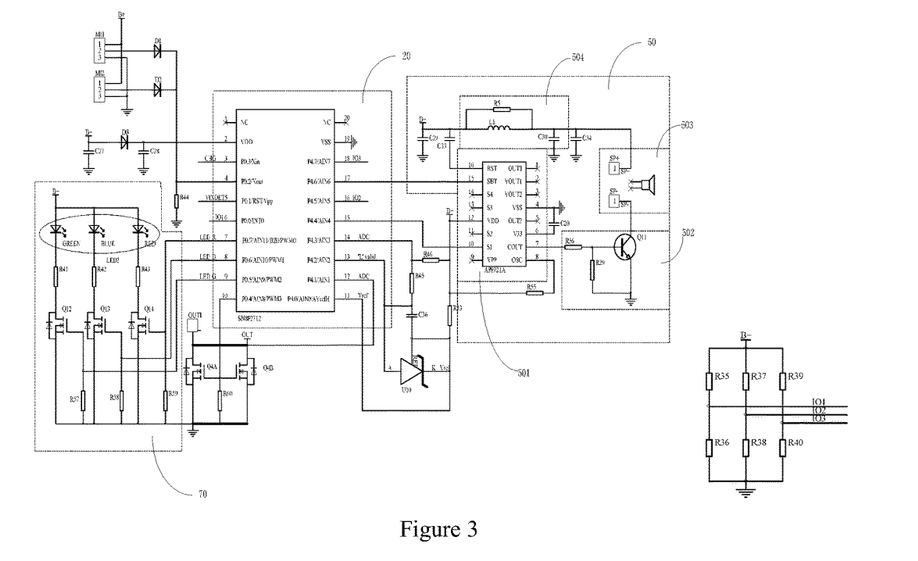
FIG. 3 is a circuit diagram of a microcontroller 20, and an airflow sensor 10, an audio module 50 and an indication unit 60 which are connected to the microcontroller 20.

FIG. 3 is a circuit diagram of a microcontroller 20, and an airflow sensor 10, an audio module 50 and an indication unit 60 which are connected to the microcontroller 20, as illustrated by FIG. 1 to FIG. 3, in the present embodiment, the microcontroller 20 is preferred to be realized by a model SN8P2712 chip and the control module comprises at least two airflow sensors, one of the airflow sensors is connected to the microcontroller 20 through an interface MI1, the other airflow sensor is a standby airflow sensor which is connected to the microcontroller 20 through an interface MI2, when one of the airflow sensors is invalid, the control circuit can still control a normal operation of the electronic cigarette. Specifically, signal output terminals of the two airflow sensors are respectively connected to a "4" pin of the microcontroller 20 through corresponding interfaces and diodes D1 and D2.

When users smoke the electronic cigarette, high speed airflow is produced, the airflow sensors sense the airflow and then convert it into a smoking signal and send the smoking signal to the "4" pin of the microcontroller 20, when the "4" pin of the microcontroller 20 detects the smoking signal, a signal is outputted to the audio chip 501 in the audio module 50 through a "17" pin and a "15" pin, in the present embodiment, a model of the audio chip 501 is preferred to be AP8921A, the "17" pin of the microcontroller 20 is connected to the "15" pin of the audio chip AP8921A, when the "4" pin of the microcontroller 20 detects the smoking signal, the "17" pin of the microcontroller 20 outputs a signal to start the audio chip, the "15" pin of the microcontroller 20 is connected to a "10" pin of the audio chip AP8921A to select corresponding audio information, namely, a water sound audio information prerecorded by the audio chip, the water sound audio information is outputted to the sound amplifying unit 502 by a "7" pin, then via a amplifying function of a transistor Q11 in the sound amplifying unit 502, the speaker 503 (shown as SPK1 in the figures) gives out the hookah-simulating water sound corresponding to the water sound audio information, thus the hookah-simulating water sound can be simulated, it has no need to behavior as the electronic cigarette in the prior arts that to match with a bottle or a basin of storing water to produce the water sound when users are smoking.

Specifically, the filter unit 504 comprises a resistor R5, an inductor L1 and a capacitor C30, the sound amplifying unit 502 comprises a resistor R56, a resistor R29 and a switch tube Q11, one end of the resistor R5 and the inductor L1 after being connected in parallel is connected to the battery 30 and a reset end of the audio chip 501 which is a "16" pin, the other end of the resistor R5 and the inductor L1 after being connected in parallel is connected to a positive input terminal SP+ of the speaker 503; one end of the resistor R56 is connected to an audio signal output terminal of the audio chip 501 which is the "7" pin, the other end of the resistor R56 is connected to one end of the resistor R29 and a base of the switch tube Q11, the other end of the resistor R29 and an emitter of the switch tube Q11 are both grounded, a collector of the switch tube Q11 is connected to a negative input terminal SP− of the speaker 503.

In the present embodiment, the indication unit 60 specifically comprises a tricolor LED lamp LED2, the tricolor LED lamp LED2 comprises a red light-emitting diode RED, a blue light-emitting diode BLUE and a green light-emitting diode GREEN, anodes of the red light-emitting diode, the blue light-emitting diode and the green light-emitting diode are all connected to a positive electrode of the battery 30. A cathode of the red light-emitting diode, a cathode of the blue light-emitting diode and a cathode of the green light-emitting diode respectively and correspondingly go through a resistor R43, a resistor R42 and a resistor R41, then are respectively connected to drains of three field effect tubes which are a drain of a field effect tube Q14, a drain of a field effect tube Q13 and a drain of a field effect tube Q12, a source of the field effect tube Q14 is grounded, sources of the field effect tube Q13 and the field effect tube Q12 are grounded via a resistor R58 and a resistor R57 respectively. Grids of the three field effect tubes are respectively and correspondingly connected to three output terminals of the microcontroller 20 which are the "7" pin to a "9" pin. The microcontroller 20 further comprises three input terminals IO1 to IO3 which are respectively corresponding to a "6" pin, the "16" pin and a "18" pin, as shown in figures, an input terminal IO1 is connected to a connection point of a resistor R35 and a resistor R36, an input terminal IO2 is connected to a connection point of a resistor R37 and a resistor R38, an input terminal IO3 is connected to a connection point of a resistor R39 and a resistor R40. When level states of the three input terminals are required to be changed, it is only need to pull the resistors up and down, namely, the three input terminals can respectively connected to the positive electrode of the battery 30 or grounded, when an input terminal is connected to the battery, then a level state of the input terminal is a high level, when an input terminal is grounded, a level state of the input terminal is a low level.

The microcontroller 20 further comprises a memory cell (not shown in figures), the memory cell stores level states of the three input terminals IO1 to IO3 of the microcontroller 20 and the colors corresponding to the level states of the three input terminals for indicating the different charging states of the battery 30. When the "4" pin of the microcontroller 20 fails to detect the smoking signal, the microcontroller 20 finds a first color corresponding to an indication of the different charging states of the battery according to the level states of the three input terminals IO1 to IO8, and controls the tricolor LED lamp to emit a light of the first color via outputting a corresponding signal by the three input terminals which are connected to the tricolor LED lamp which is the "7" pin to the "9" pin of the microcontroller 20. Specifically, the first color comprises a color configured for indicating the battery 30 is in the charging state and a color configured for indicating the battery 30 is in the full power state, meanwhile, the color configured for indicating the battery 30 is in the charging state is different with the color configured for indicating the battery 30 is in the full power state.

The memory cell above is also provided with a second color corresponding to the level states of the three input terminals IO1 to IO3 of the microcontroller 20 for indicating that an user is smoking, namely, the color indicated by the tricolor LED lamp which is controlled by the microcontroller 20 when the "4" pin of the microcontroller 20 receives the smoking signal. When the microcontroller 20 detects the smoking signal, according to the level states of the three input terminals IO1 to IO3, the microcontroller 20 finds the second color corresponding to an indication that the user is smoking, and controls the tricolor LED lamp to emit a light of the second color via outputting a corresponding signal by the "7" pin to the "9" pin of the microcontroller 20.

The microcontroller 20 pre-stores the level states of the three input terminals IO1 to IO3 and corresponds to the colors corresponding to the different charging states of the battery 30 and the color when smoking, they are shown as Table 1.

TABLE 1

| Interface IO | Value | Charging state | Full power state | Smoking color |
|---|---|---|---|---|
| IO1 IO2 IO3 | 000 | Red | Green | Red |
| | 001 | Red | Green | Orange |
| | 010 | Red | Green | Green |
| | 011 | Red | Green | Blue |
| | 100 | Red | Green | Pink |
| | 101 | Red | Green | Puzzle |
| | 110 | Red | Green | White |
| | 111 | Green | Red | White |

For instance, when the three input terminals IO1 to IO3 of the microcontroller 20 are all grounded, level states are low levels, and a corresponding value is 000, then a "3" pin of the microcontroller 20 detects charging states of the batter 30, if the "3" pin of the microcontroller 20 is a low level, it indicates that the battery is in a charging state, then the microcontroller 20 controls the tricolor LED lamp to show a red color via the "7" pin to the "9" pin. If the "3" pin of the microcontroller 20 is a high level, it indicates that the battery is in a full power state, then the microcontroller 20 controls the tricolor LED lamp to show a green color via the "7" pin to the "9" pin. Besides, when the "4" pin of the microcontroller 20 receives the smoking signal, then the microcontroller 20 controls the tricolor LED lamp to show a red color as well, and as long as the users are smoking, the microcontroller 20 controls the tricolor LED lamp to show the smoking color, only when the smoking signal is not received, it shows the colors corresponding to the charging states.

Again for instance, when input terminals IO1 and IO2 of the microcontroller 20 are all grounded, the input terminal IO3 is connected to the positive electrode of the battery, level states of the input terminals IO1 and IO2 are low levels, a level state of the input terminal IO3 is a high level, and a corresponding value is 001, in a charging state and a full power state of the battery 30, the microcontroller 20 controls the tricolor LED lamp to show a red color and a green color respectively. A different is that, when the "4" pin of the microcontroller 20 receives the smoking signal, then the microcontroller 20 controls the tricolor LED lamp to show an orange color. Other situation is similar, and will not be explained here. Therefore, it can easily change the level status of the microcontroller input terminals IO1 to IO3 (pull the resistors up and down), so as to change the colors indicated by the tricolor LED lamp when the battery is in different charging states and the color indicated by the tricolor LED lamp when smoking.

In the control circuit above, when the "4" pin of the microcontroller 20 receives the smoking signal, a simulating water sound audio information is outputted by the audio chip 501 via a control of the microcontroller 20, then the hookah-simulating water sound is outputted by motivating the speaker 503 after the amplifying function, and meanwhile, output a signal by the "7" pin to the "9" pin of the microcontroller 20 to control the tricolor LED lamp in the indication unit 60 to emit a light of the smoking color light, the smoking color is pre-stored in the memory cell of the microcontroller 20. In addition, a volume of the hookah-simulating water sound can be outputted by adjusting the speaker, the audio chip can classify the volume into different grades, and a detected representative volume signal is fed back to the microcontroller, the microcontroller determines a grade in which a current volume of the hookah-simulating water sound outputted by the speaker is according to the signal, then controls the tricolor LED lamp in the indication unit to emit a light of a corresponding color, namely, volume grades and corresponding smoking colors are pre-stored in the memory cell in the microcontroller 20.

The second switch unit in the above control circuit comprises field effect tubes Q4A and Q4B and a resistor R60, drains of the field effect tubes Q4A and Q4B are both connected to a "10" pin of the microcontroller 20, when the "4" pin of the microcontroller 20 receives the smoking signal, the microcontroller 20 controls the "10" pin to input a high level signal to control conduction of the field effect tubes Q4A and Q4B, and a heating wire in the electronic cigarette atomizer is connected between the positive electrode of the battery and a source of a field effect tube Q4B which is a terminal OUT, when the field effect tubes Q4A and Q4B are turned on, it is equivalent to the heating wire is connected between the battery positive electrode and ground, namely, namely, an electrical power supply circuit of the battery and the heating wire is switched on, the heating wire generates heat to atomize the cigarette oil to realize an electronic cigarette normal work.

Figure 4:
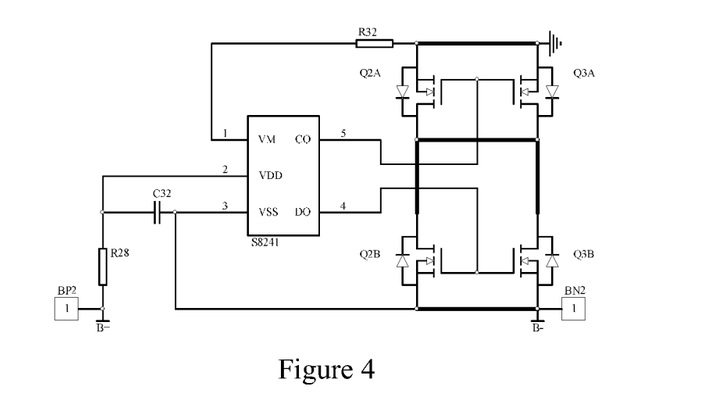
FIG. 4 is a circuit diagram of a battery protective module.

FIG. 4 is a circuit diagram of a battery protective module which comprises a battery protective chip and a first switch unit, as shown in the figure, a model of the battery protective chip is S8241, the first switch unit comprises field effect tubes Q2A and Q3A and field effect tubes Q2B and Q3B. When the battery 30 is detected in an over charged state, a signal is outputted via a "5" pin of the battery protective chip S8241 to control a disconnection of the field effect tubes Q2A and Q3A, then the external power supply no longer charges the battery 30. When the battery 30 is detected in an over discharged state, a signal is outputted via the "4" pin of the battery protective chip S8241 to control a disconnection of the field effect tubes Q2B and Q3B, then the battery no longer provides the internal power supply.

The present invention further provides an electronic cigarette, the electronic cigarette comprises the control circuit in the above embodiments, the electronic cigarette comprises an atomizer configured for atomizing the cigarette oil, the atomizer comprises a heating wire configured for atomizing the cigarette oil, when the microcontroller 20 in the control circuit detects the smoking signal, the microcontroller 20 controls the heating wire in the atomizer to work to realize an atomization of the cigarette oil of the electronic cigarette.

The present invention further provides a method for controlling the electronic cigarette, the method for controlling comprises:

After that the external power supply is converted into a direct current power supply by a direct current adapter 70, the battery 30 is processed a charge management by a charging management module 40 and the charging management module 40 sends charge states of the battery 30 to the microcontroller 20. Specifically, the charging management module 40 is realized by a charging management chip with a model BQ24090, when the battery 30 is in the charging state, then a "8" pin of the chip BQ24090 outputs a low level signal, if the battery 30 is in a full power state, then the "8" pin of the chip BQ24090 outputs a high level signal, and the signals are received by a "3" pin of the microcontroller 20.

An airflow sensor 10 collects an airflow signal upon every air inhalation into the electronic cigarette, converts the airflow signal into a smoking signal and sends the smoking signal to the microcontroller 20. In this step, when users smoke the electronic cigarette, high speed airflow is formed, the airflow sensor 10 senses the airflow and then converts it into a smoking signal and sends the smoking signal to the "4" pin of the microcontroller 20;

The microcontroller 20 controls an audio module 50 to give out a hookah-simulating water sound according to the smoking signal received. Specifically, when a "4" pin of the microcontroller 20 detects the smoking signal, a signal is respectively outputted to a "15" pin and a "10" pin of the audio chip AP8921A through a "17" pin and a "15" pin of the microcontroller 20 to start the audio chip and to output a water sound audio information prerecorded, after a amplifying function of a transistor Q11, the speaker SPK1 gives out the hookah-simulating water sound. Meanwhile, when the "4" pin of the microcontroller 20 receives the smoking signal, the "10" pin of the microcontroller 20 outputs a high level signal to control conduction of the field effect tubes Q4A and Q4B, an electrical power supply circuit of the battery 30 and the heating wire in the electronic cigarette atomizer is switched on, the heating wire works heat to an atomization of the cigarette oil of the electronic cigarette.

In the above method for controlling, a memory cell in the microcontroller 20 correspondingly pre-stores level states of the three input terminals IO1 to IO3 and colors corresponding to indicate different charging states of the battery 30 and a smoking color, when the "4" pin of the microcontroller 20 fails to detect the smoking signal, the above method for controlling further comprises:

The microcontroller 20 finds a first color corresponding to an indication of the different charging states according to the level states of three input terminals of the microcontroller 20, and controls the tricolor LED lamp to emit a light of the first color by the three input terminals of the microcontroller 20. In the present embodiment, the three input terminals of the microcontroller 20 respectively correspond to a "6" pin, a "16" pin and a "18" pin of the microcontroller 20, output terminals are a "7" pin to a "9" pin of the microcontroller 20. When the "4" pin of the microcontroller 20 fails to detect the smoking signal, the microcontroller 20 determines a current charging state of the battery according to a level state of a "3" pin of the microcontroller 20, then a corresponding signal is outputted by the three output terminals which are the "7" pin to the "9" pin of the microcontroller 20 according to level states of the three input terminals IO1 to IO3, thus to control the tricolor LED lamp (shown as LED2 in FIG. 3) to show colors of the battery in different charging state. The first color comprises two different colors which are respectively a color of the battery in a charging state and a color of the battery in a full power state.

When the "4" pin of the microcontroller 20 detects the smoking signal, the above method for controlling further comprises:

According to the level states of the three input terminals IO1 to IO3 of the microcontroller 20, the microcontroller 20 finds a second color corresponding to an indication that the user is smoking, and controls the tricolor LED lamp to emit a light of the second color via the three input terminals (the "7" pin to the "9" pin of the microcontroller 20). Namely, when users are smoking, the microcontroller 20 controls the tricolor LED lights to indicate a smoking color in a priority.

Therefore, with applications of the control circuit, the electronic cigarette and the method for controlling the electronic cigarette, by defining the microcontroller to control the audio module to produce a water sound of a hookah when the microcontroller receives the smoking signal, it realize that the water sound can be given out by means of electronic simulation when a smoker smokes the electronic cigarette, it has no need to behavior as the electronic cigarette in the prior arts that to coordinate with a bottle or a basin of storing water to produce the water sound when users are smoking, through a function of electronically simulating real hookah water sounds, it is conducive to usage of the electronic cigarette and smoking cessation, and as filter is processed by the filter unit which has a simple and skillful structure, and after the audio signal is amplified by the sound amplifying unit, the water sound has better sound quality and a larger volume, and it can vividly imitate a sound of an electronic hookah to significantly improve users' experience, and take advantages on avoiding a small sound, instability, a lot of noise, poor sound quality and other issues. Meanwhile, by defining the microcontroller to control the tricolor LED lamp to display different colors in different charging states, it realizes that the color indicating that the electronic cigarette is being smoked is shown when the users smoking electronic smoke, the colors indicating that the battery is in the charging state or is in the full power state are shown when the users does not smoke, thereby users' experience is improved.

While the embodiments of the present application are described with reference to the accompanying drawings above, the present application is not limited to the above-mentioned specific implementations. In fact, the above-mentioned specific implementations are intended to be exemplary not to be limiting. In the inspiration of the present application, those ordinary skills in the art can also make many modifications without breaking away from the subject of the present application and the protection scope of the claims. All these modifications belong to the protection of the present application.

What is claimed is:

1. A control circuit for controlling an electronic cigarette, wherein the control circuit comprises at least one airflow sensor (10), a microcontroller (20) connected to the airflow sensor (10), a battery (30) for providing an internal power supply, an audio module (50) and an indication unit (60) the audio module (50) and the indication unit (60) both connected to the microcontroller (20);

wherein the airflow sensor (10) is configured for collecting an airflow signal upon every air inhalation into the electronic cigarette, converting the airflow signal into a smoking signal and sending the smoking signal to the microcontroller (20), the microcontroller (20) is configured for controlling the audio module (50) to give out a hookah-simulating water sound according to the smoking signal received, and simultaneously controlling the indication unit (60) to display a smoking color; the microcontroller (20) is further configured for controlling the indication unit (60) to display different indication colors according to different charging states of the battery (30);

wherein the audio module (50) comprises an audio chip (501) connected to the microcontroller (20), and further comprises a filter unit (504) and a sound amplifying unit (502) which are connected to the audio chip (501) respectively, and a speaker (503) connected to the filter unit (504) and the sound amplifying unit (502) respectively, the microcontroller (20) is configured for starting the audio chip (501) when the smoking signal is received, the audio chip (501) outputs a prerecorded water sound audio signal, and the water sound audio signal is amplified by the sound amplifying unit (502), then the speaker (503) is driven to give out the hookah-simulating water sound; and wherein the filter unit (504) comprises a resistor R5, an inductor L1 and a capacitor C30, the sound amplifying unit (502) comprises a resistor R56, a resistor R29 and a switch tube Q11, wherein one end of the resistor R5 and the inductor L1 after being connected in parallel is connected to the battery (30) and a reset end of the audio chip (501), the other end of the resistor R5 and the inductor L1 after being connected in parallel is connected to the speaker (503); one end of the resistor R56 is connected to an audio signal output terminal of the audio chip (501), the other end of the resistor R56 is connected to one end of the resistor R29 and a base of the switch tube Q11, the other end of the resistor R29 and an emitter of the switch tube Q11 are both grounded, a collector of the switch tube Q11 is connected to the speaker (503).

2. The control circuit according to claim 1, wherein the indication unit (60) comprises a tricolor LED lamp, the tricolor LED lamp comprises a red light-emitting diode, a blue light-emitting diode and a green light-emitting diode, anodes of the red light-emitting diode, the blue light-emitting diode and the green light-emitting diode are all connected to a positive electrode of the battery (30); and wherein the indication unit (60) further comprises three switch tubes which are respectively connected to a cathode of the red light-emitting diode, a cathode of the blue light-emitting diode and a cathode of the green light-emitting diode, grids of the three switch tubes are respectively and correspondingly connected to three output terminals of the microcontroller (20).

3. The control circuit according to claim 2, wherein the microcontroller (20) comprises three input terminals, the control circuit further comprises six resistors R35~R40, wherein series connected resistors R35 and R36, series connected resistors R37 and R38, and series connected resistors R39 and R40 are respectively connected in parallel between the positive electrode of the battery (30) and the ground, the three input terminals are respectively and correspondingly connected to a connecting point of the resistors R35 and R36, a connecting point of the resistors R37 and R38, and a connecting point of the resistors R39 and R40.

4. The control circuit according to claim 3, wherein the microcontroller (20) further comprises a memory cell, the memory cell is configured to store level states of the three input terminals and the colors corresponding to the level states of the three input terminals for indicating the different charging states of the battery (30); and wherein according to the level states of the three input terminals, the microcontroller (20) finds a first color corresponding to an indication of the different charging states when the microcontroller (20) fails to detect the smoking signal, and controls the tricolor LED lamp to emit a light of the first color via the three input terminals, wherein charging states of the battery (30) comprises a charging state and a full power state.

5. The control circuit according to claim 4, wherein the first color comprises a color configured for indicating the battery (30) is in the charging state and a color configured for indicating the battery (30) is in the full power state, wherein the color configured for indicating the battery (30) is in the charging state is different with the color configured for indicating the battery (30) is in the full power state.

6. The control circuit according to claim 5, wherein the memory cell is further configured to store a second color corresponding to the level states of the three input terminals for indicating that an user is smoking; and wherein according to the level states of the three input terminals, the microcontroller (20) finds the second color corresponding to an indication that the user is smoking when the microcontroller (20) detects the smoking signal, and controls the tricolor LED lamp to emit a light of the second color via the three input terminals, the second color is the smoking color.

7. The control circuit according to claim 1, wherein the control circuit further comprises a battery protective module connected to the battery (30), the battery protective module comprises a protective control chip and a first switch unit which is connected to the control chip, the protective control chip is configured for detecting an over charged state and an over discharged state of the battery (30), and controlling the first switch unit to turn off when the battery (30) is in the over charged state or the over discharged state.

8. The control circuit according to claim 1, wherein the control circuit further comprises a second switch unit connected to the microcontroller (20), the microcontroller (20) is configured for controlling the second switch unit to turn on when the microcontroller (20) detects the smoking signal, so as to switch on a power supply circuit between the battery (30) and an electronic cigarette atomizer to realize an atomization of cigarette oil of the electronic cigarette.

9. The control circuit according to claim 1, wherein the control circuit further comprises a charge management module (40) connected to the battery (30) and configured for processing a charge management for the battery (30) and transmitting the charging states of the battery (30) to the microcontroller (20), the battery (30) is charged by a direct current power supply which is converted by an external power source through a direct current adapter (70).

10. An electronic cigarette, wherein the electronic cigarette comprises the control circuit according to claim 1.

11. The electronic cigarette according to claim 10, wherein the electronic cigarette comprises an atomizer configured for atomizing the cigarette oil, the atomizer comprises a heating wire, when the control circuit detects the smoking signal, the control circuit controls the atomizer to work, the heating wire generates heat to realize an atomization of cigarette oil of the electronic cigarette.

12. A method for controlling an electronic cigarette, wherein the method for controlling comprises:

collecting an airflow signal upon every air inhalation into the electronic cigarette, converting the airflow signal into a smoking signal and sending the smoking signal to a microcontroller (20) by an airflow sensor (10);

controlling an audio module (50) to give out a hookah-simulating water sound according to the smoking signal received and simultaneously controlling an indication unit (60) to display a smoking color by the microcontroller (20);

controlling an atomizer of the electronic cigarette to work according to the smoking signal received, so as to realize an atomization of cigarette oil of the electronic cigarette.

13. The method for controlling an electronic cigarette according to claim 12, wherein the microcontroller (20) further comprises a memory cell, the memory cell stores level states of three input terminals of the microcontroller (20) and colors corresponding to the level states of the three input terminals for indicating different charging states of the battery (30); if the microcontroller (20) fails to detect the smoking signal, the method for controlling further comprises:

finding a first color corresponding to an indication of the different charging states, and controlling a tricolor LED lamp to emit a light of the first color via the three input terminals by the microcontroller (20), according to the level states of the three input terminals of the microcontroller (20).

14. The method for controlling an electronic cigarette according to claim 13, wherein the memory cell also stores a second color corresponding to the level states of the three input terminals for indicating that an user is smoking; if the microcontroller (20) detects the smoking signal, the method for controlling further comprises:

according to the level states of the three input terminals of the microcontroller (20), the microcontroller (20) finds the second color corresponding to an indication that the user is smoking, and controls the tricolor LED lamp to emit a light of the second color via the three input terminals.

15. The method for controlling an electronic cigarette according to claim 13, wherein after that a direct current power supply is obtained by being converted by an external power source through a direct current adapter (70), a charge management module (40) processes a charge management for the battery (30) and transmits charging states of the battery (30) to the microcontroller (20), wherein the charging states of the battery (30) comprises a charging state and a full power state.

* * * * *